US00RE40383E

(19) United States
(12) Reissued Patent
Han

(10) Patent Number: US RE40,383 E
(45) Date of Reissued Patent: Jun. 17, 2008

(54) STUD AND RIDER FOR USE ON MATRIX TRAYS

(75) Inventor: Tiang Fong Han, Teliti (SG)

(73) Assignee: E.PAK Resources (S) Pte Ltd, Singapore (SG)

(21) Appl. No.: 10/786,915

(22) Filed: Feb. 25, 2004

Related U.S. Patent Documents

Reissue of:
(64) Patent No.: 6,349,832
Issued: Feb. 26, 2002
Appl. No.: 09/368,125
Filed: Aug. 4, 1999

(30) Foreign Application Priority Data

Jun. 7, 1999 (SG) ..... 9902708-8

(51) Int. Cl.
*B65D 85/90* (2006.01)

(52) U.S. Cl. ..... 206/724; 206/725; 206/459.5
(58) Field of Classification Search ..... 206/459.1, 206/459.5, 575, 722, 724, 725
See application file for complete search history.

(56) References Cited

U.S. PATENT DOCUMENTS

| | | | | |
|---|---|---|---|---|
| 3,675,620 | A | * 7/1972 | Baustin | 116/308 |
| 3,841,260 | A | * 10/1974 | Sharp et al. | 116/325 |
| 4,148,273 | A | * 4/1979 | Hollingsworth et al. | 116/325 |
| 5,316,166 | A | 5/1994 | Pavely et al. | |
| 5,476,176 | A | 12/1995 | Gregerson et al. | |
| 5,560,775 | A | 10/1996 | Conboy et al. | |
| 5,769,227 | A | 6/1998 | Fantone | |
| 5,791,486 | A | 8/1998 | Brahmbhatt | |
| 5,890,599 | A | 4/1999 | Murphy | |
| 5,957,293 | A | 9/1999 | Pakeriasamy | |
| 6,536,593 | B2 | 3/2003 | Hatakeyama | |

* cited by examiner

*Primary Examiner*—David T Fidei
(74) *Attorney, Agent, or Firm*—Carlson, Gaskey & Olds

(57) ABSTRACT

A carrier for articles has a main body (10) with one or more engagement means (28) for receiving one or more indicators (40, 60). The indicators (40, 60) have one or more contrasting colors compared to the color of the main body (10). The color or shape or both of the indicator provides the user with information regarding the articles, carrier or characteristics of the articles or carrier.

23 Claims, 11 Drawing Sheets

STUD AND RIDER FOR USE ON MATRIX TRAYS

Matter enclosed in heavy brackets [ ] appears in the original patent but forms no part of this reissue specification; matter printed in italics indicates the additions made by reissue.

TECHNICAL FIELD

This invention relates to carriers for objects and more particularly to the easy identification and/or orientation of such carriers during manufacturing processes. The invention has particular relevance to the semiconductor industry.

BACKGROUND ART

In the semiconductor industry semiconductor chips such as microprocessors and the like are packaged on carriers called matrix trays. The matrix trays carry a number of semiconductor chips which are passed along a production line for assembly of completed circuit boards. The matrix trays are typically injection moulded plastics having a height of about 1 cm.

The trays carry technical information relevant to the tray, the chips carried or the process, such as temperature rating, part number, date code, etc. This technical information is usually embossed on the edge of the trays, which is typically about 1 cm high. As the trays flow through the production line the following inconveniences occur:

1. Difficulty in reading the embossed descriptions on tray surfaces, especially when they are stacked high. The printed information is not large enough due to the limited space on the edge of the tray. Also, the printed characters and numbers are the same colour as the tray's surfaces so there is little contrast to aid in reading them.
2. Difficulty in identifying trays that house good chips as against those used to store rejected ones. When bad chips are identified and segregated by the machines during the assembly process, they are separated but housed onto the same type of trays. The same type of trays are needed as they are specifically designed to house a particular size and family type of chips.
3. Difficulty in identifying different types of chips within a family that use the same body dimension of the tray. As different machines are required for handling a particular type of chip within a family, the use of the common tray makes it difficult to identify the correct chips for each machine.
4. Difficulty in identifying the correct tray orientation during the machine loading. The tray must be loaded manually with a specific orientation. Although present trays come with a tiny corner chamfer on one of its corners, it is not conspicuous enough to ensure correct loading onto the machine.

It has been proposed to use coloured stickers to help differentiate certain trays from others. However, the stickers need to be removed before delivery to customers and this sometimes leaves adhesive material on the tray.

DISCLOSURE OF THE INVENTION

In an attempt to overcome at least some of the disadvantages of existing matrix trays, in one broad form the invention provides a carrier for supporting one or more articles, the carrier including:

a main body having at least one engagement means; and at least one indicator means for engagement with the engagement means, the or each at least one indicator means including means to provide information visually or tactually to an observer regarding the carrier or the articles supported thereon or both.

In a preferred form, the invention is a semi conductor matrix tray having at least one removable indicator means. The indicator means may be positioned prominently along one side of the tray and be assigned different colours, shapes or numbers to indicate technical information. Preferably the colours used for the indicator means contrast with the colour of the tray adjacent the indicator means.

Preferably the indicator means slides into a receptacle on one side of the tray. Preferably the receptacle and the indicator means are shaped so that only one orientation of the indicator means relative to the receptacle is allowed. The indicator means may have a receptacle which receives a protrusion on the tray.

Preferably the indicator means includes a first part which engages in or on the edge of the tray and a second part mounted on the first part. The first part may then be made of one of a series of different colours whilst the second part may also be made of one of a series of different colours and/or shape.

One or both of the first and second parts may be of a contrasting colour to the tray or the same colour. The second part may partially or totally obscure the first part when the indicator is mounted on the tray.

More than one indicator may be used on the one tray.

The invention will be more easily understood from the following non limiting description of a preferred embodiment and the drawings in which:

BEST MODE OF CARRYING OUT THE INVENTION

Figure 1:
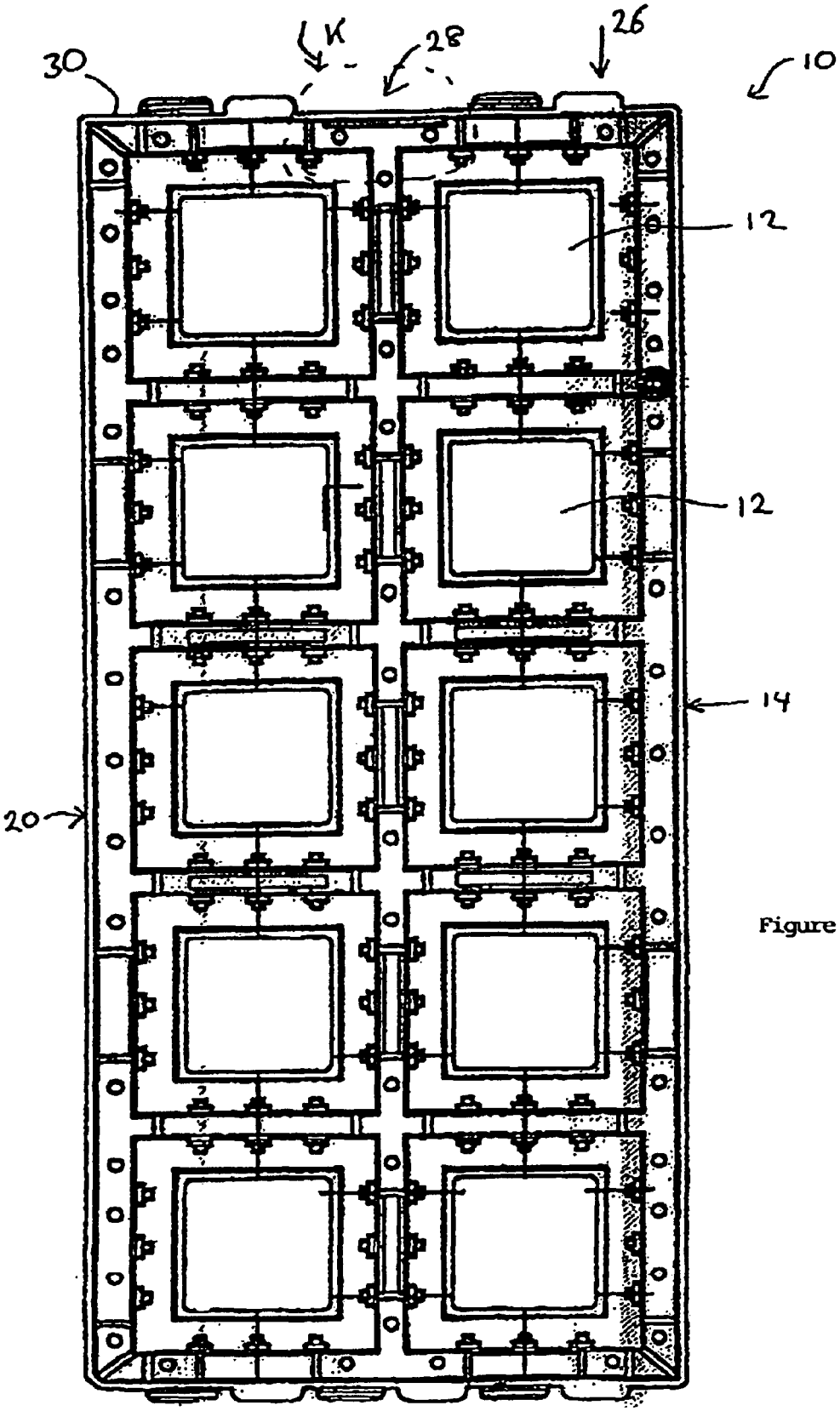
FIG. 1 is a plan view of a matrix tray made according to the present invention.
Figure 2:
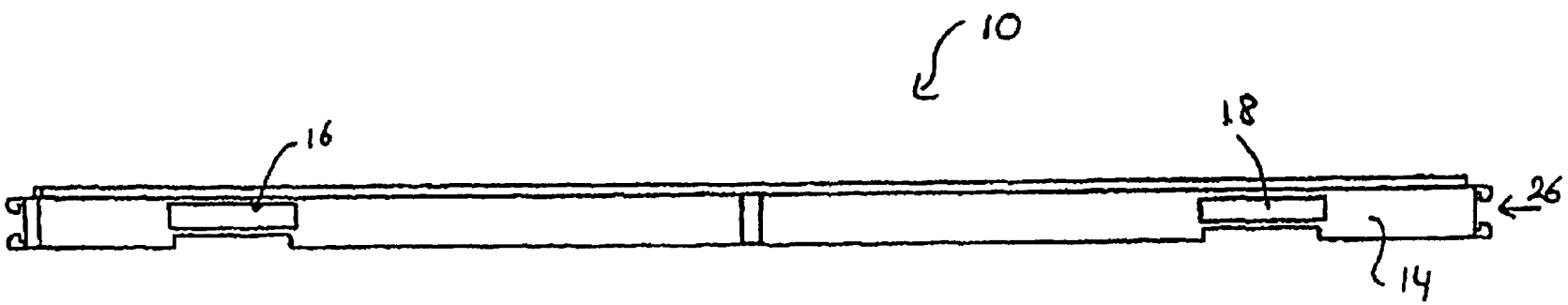
FIG. 2 is a front side view of the matrix tray of FIG. 1.
Figure 3:
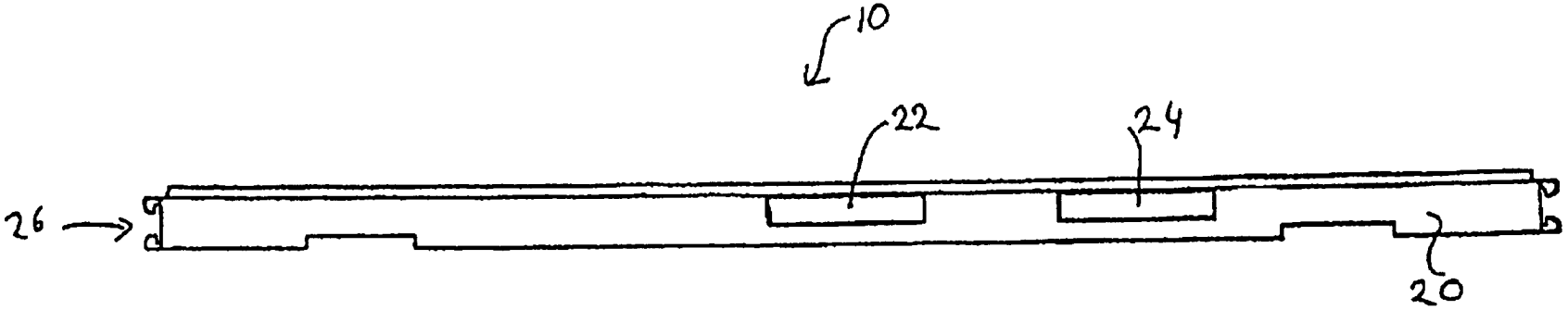
FIG. 3 is a rear side view of the matrix tray of FIG. 1.

Referring to FIGS. 1 to 5 there is shown a matrix tray 10 configured to carry semiconductor chips in a 5×2 array. Each chip is carried in a receptacle 12. The tray 10 carries on its front side 14 temperature rating information 16 and a part number 18. Its rear side 20 also carries a part number 22 and other information 24. This information is moulded into the plastics of the tray in manufacture and so is inherently difficult to read. In the prior art this is all that is available for operators to identify the trays, their content and other information relevant to the manufacturing process.

Figure 4:
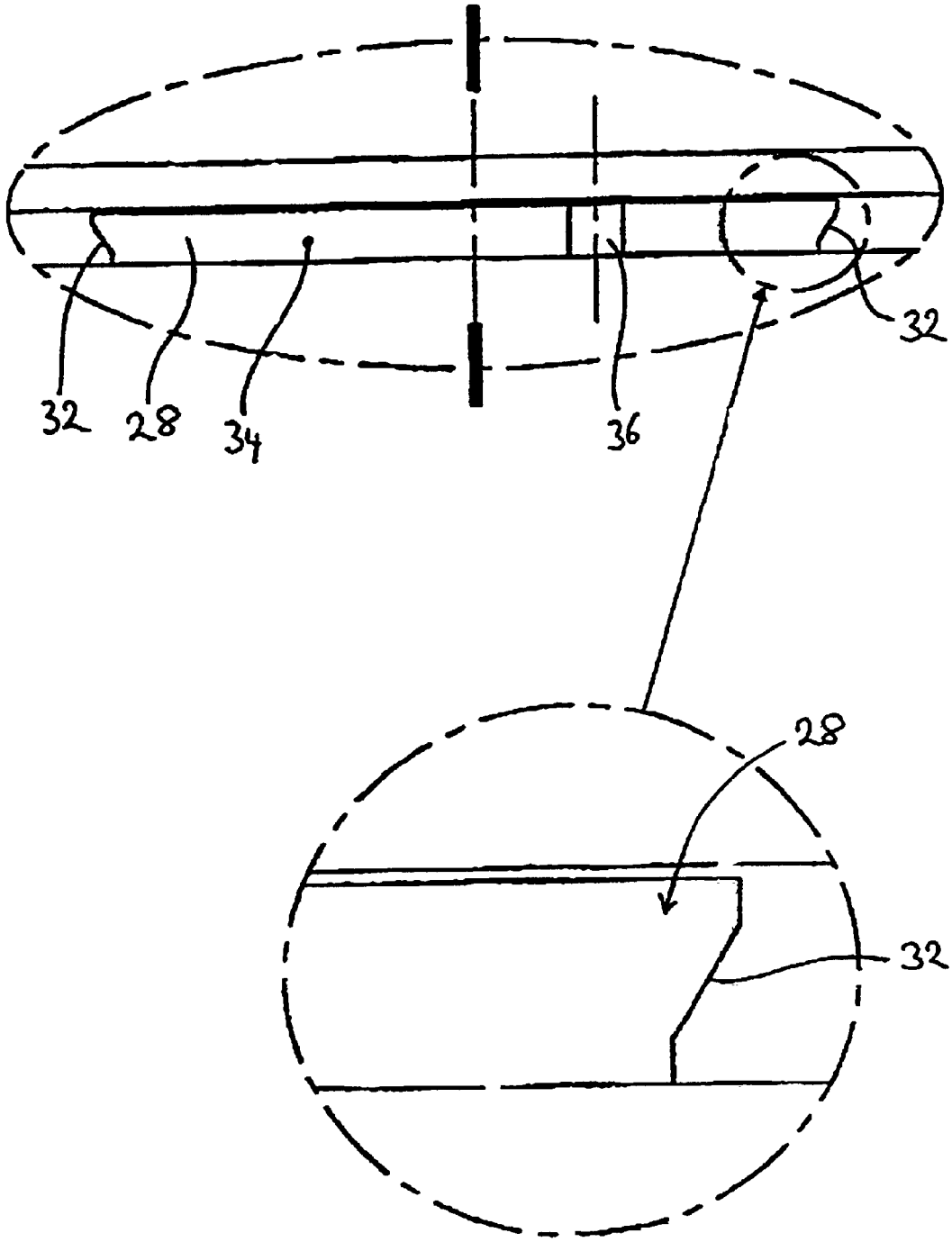
FIG. 4 is a plan view of the end area of the tray of FIG. 1 indicated by arrow K.
Figure 5:
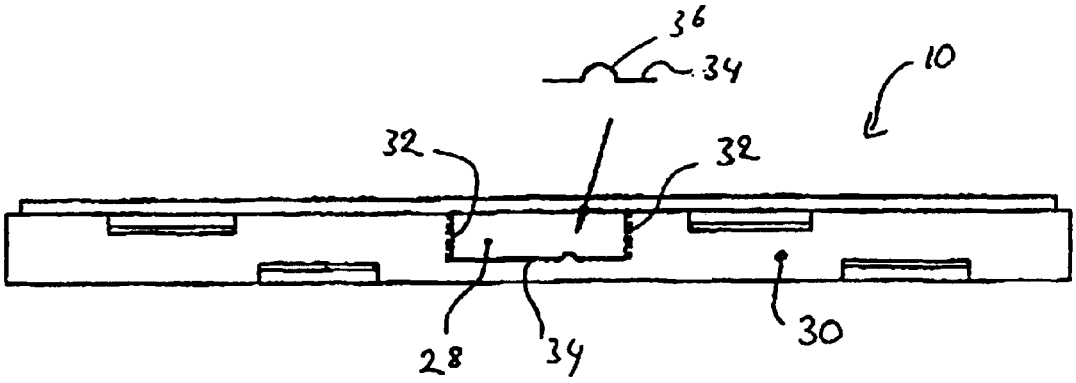
FIG. 5 is an end elevation of the area indicated by the arrow K.
Figure 6:
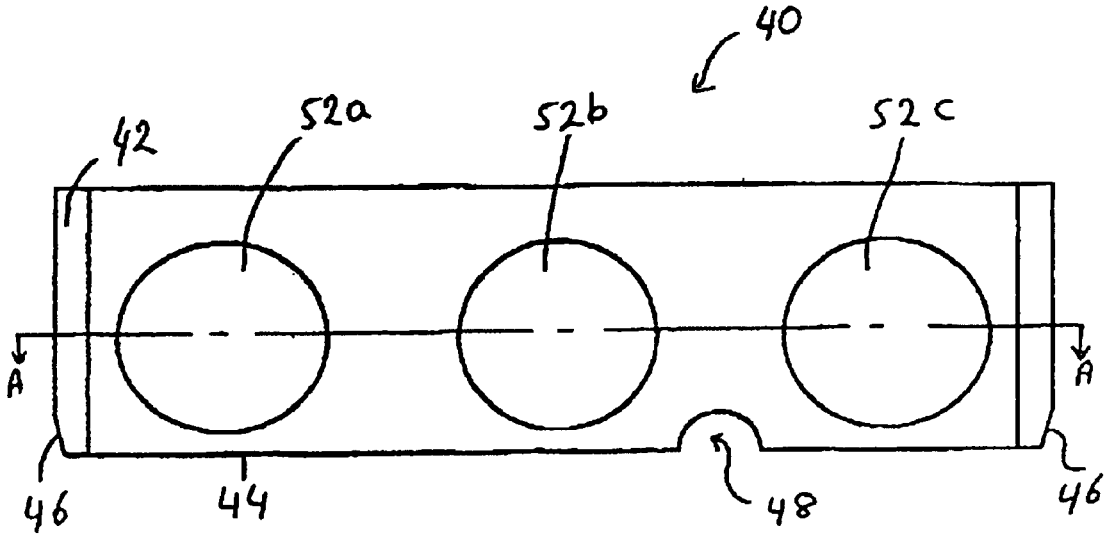
FIG. 6 is a front elevation view of a rider portion of an indicator for use with the tray of FIG. 1.
Figure 7:
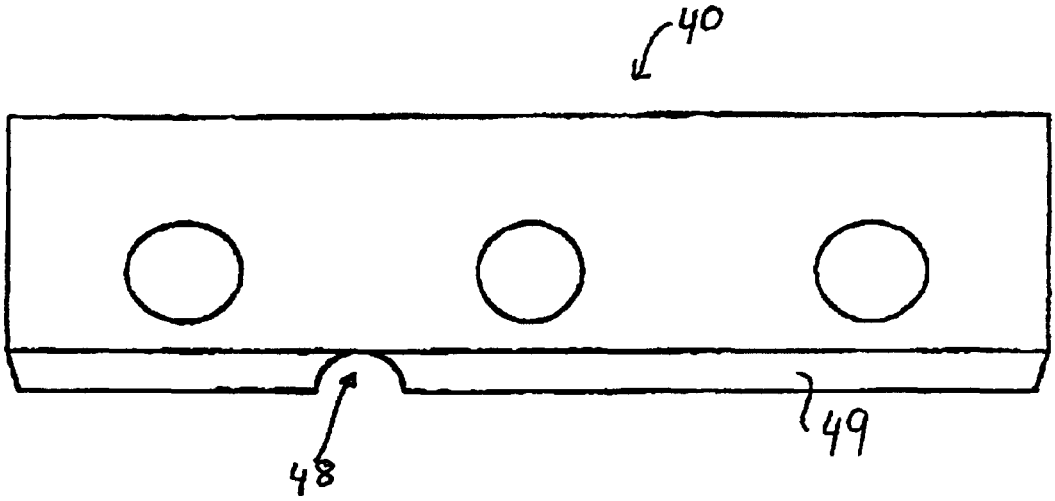
FIG. 7 is a rear elevation view of the rider of FIG. 6.
Figure 8:
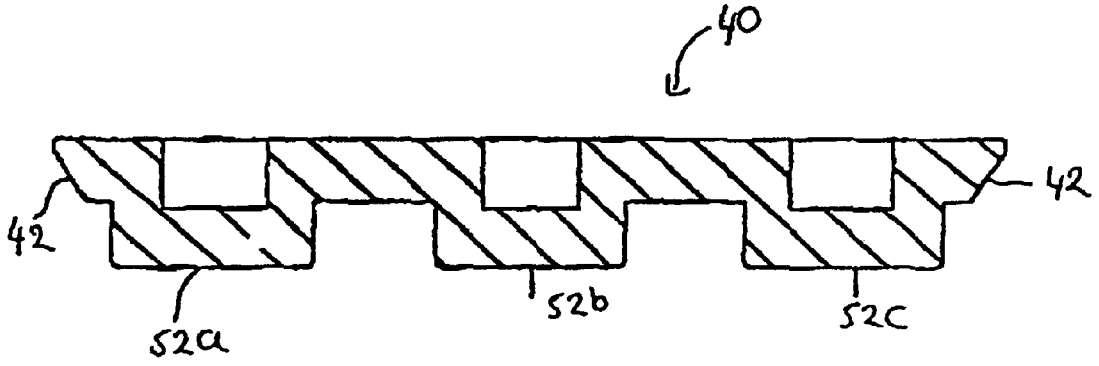
FIG. 8 is a cross-sectional view taken along line AA in FIG. 6.
Figure 9:
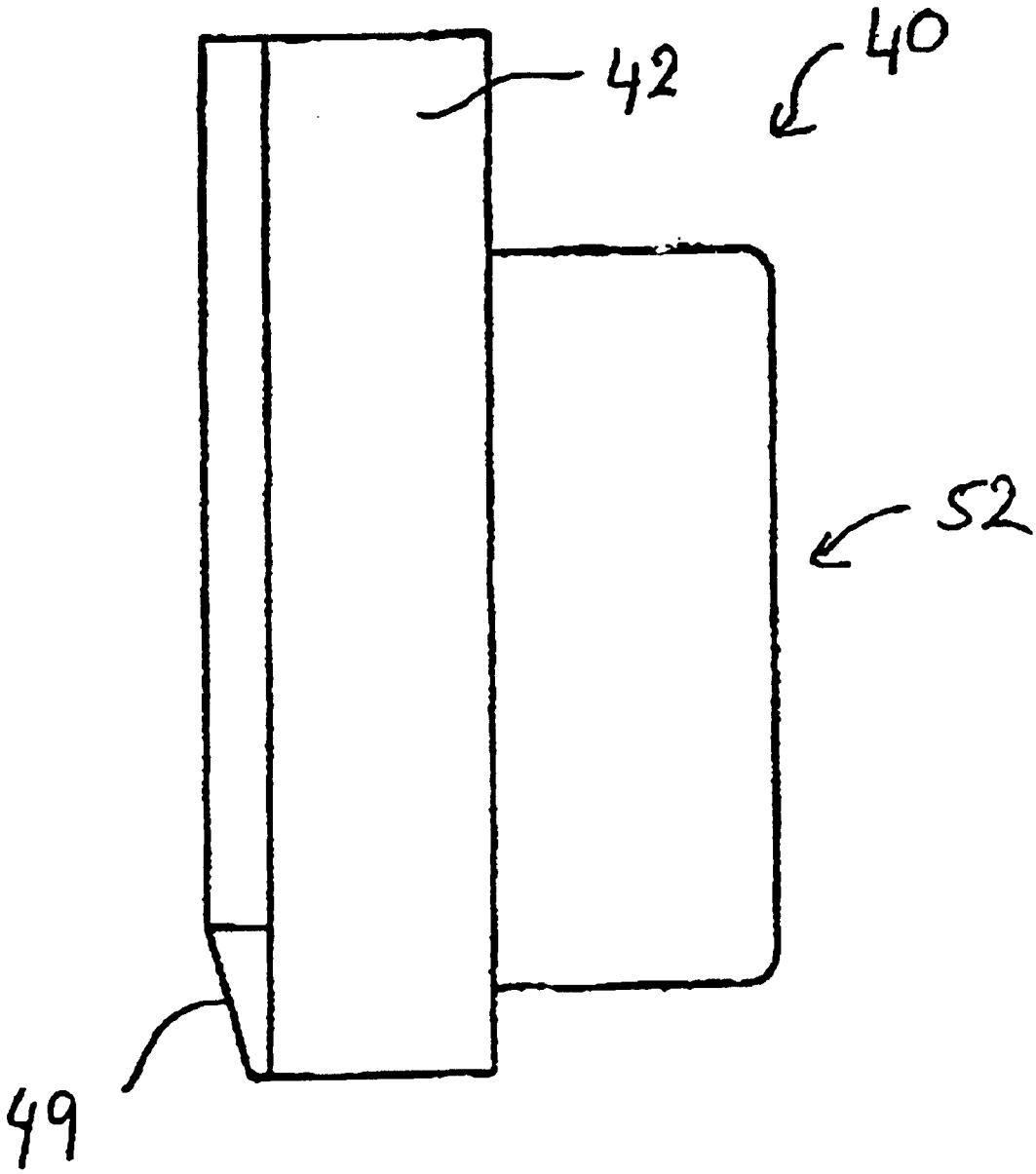
FIG. 9 is an end elevation of the FIG. 6 rider.

In the tray of FIGS. 1 to 5 one end 26 is provided with a slot 28 in its end wall 30 (see FIGS. 4 and 5). This slot is generally rectangular in shape having vertical sides 32 and horizontal base 34. The sides 32 are angled at about 60° to the end wall 30 so the width of the front of the slot 28 is less than the width at its rear. The base 34 has a semicircular protrusion 36 extending upwards. The protrusion is located off centre of the slot 28.

Referring to FIGS. 6 to 9 there is shown a rider 40 for insertion into the slot 28 of the tray 10. The rider 40 is generally rectangular and has the same overall width, depth and height as the slot 28. The ends 42 of the rider are also angled at 60° so that the rider may be slid into the slot 28. It will be appreciated that the angling of the ends of the slot 28 and rider 40 mean that the rider is trapped in the slot 28 and cannot fall out of the front of the recess. The bottom of the ends is chamfered at 46 to aid insertion of the rider into slot 28. The base of the rear face is also preferably chamfered at 49 to aid insertion.

The bottom edge 44 of the rider has a semicircular recess 48 which corresponds to the protrusion 36 in the slot 28. The protrusion 36 and recess 48 prevent the rider being fully inserted into the slot 28 upside down.

Protruding from the front face 50 of the rider are three identical circular protrusions 52a, b and c. These protrusions 52 are preferably equally spaced from each other with the middle protrusion 52b located at the horizontal centre of the rider. Preferably the protrusion 52 extend horizontally along a line slightly below the vertical centre of the rider. The thickness of the main portion of the rider is equal to that of the slot 28, so the protrusions 52 extend proud of the end wall 30.

Figure 11:
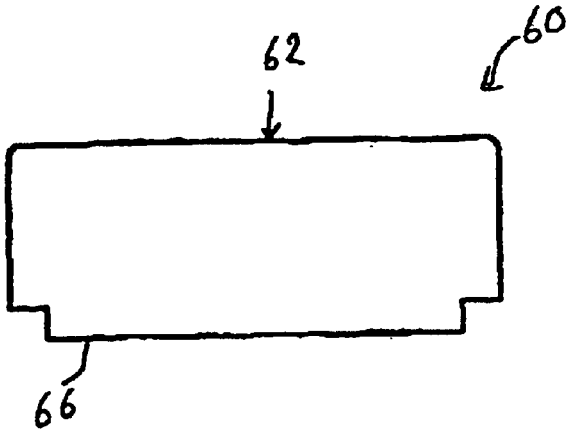
FIG. 11 is an end elevation view of the stud of FIG. 10.
Figure 10:
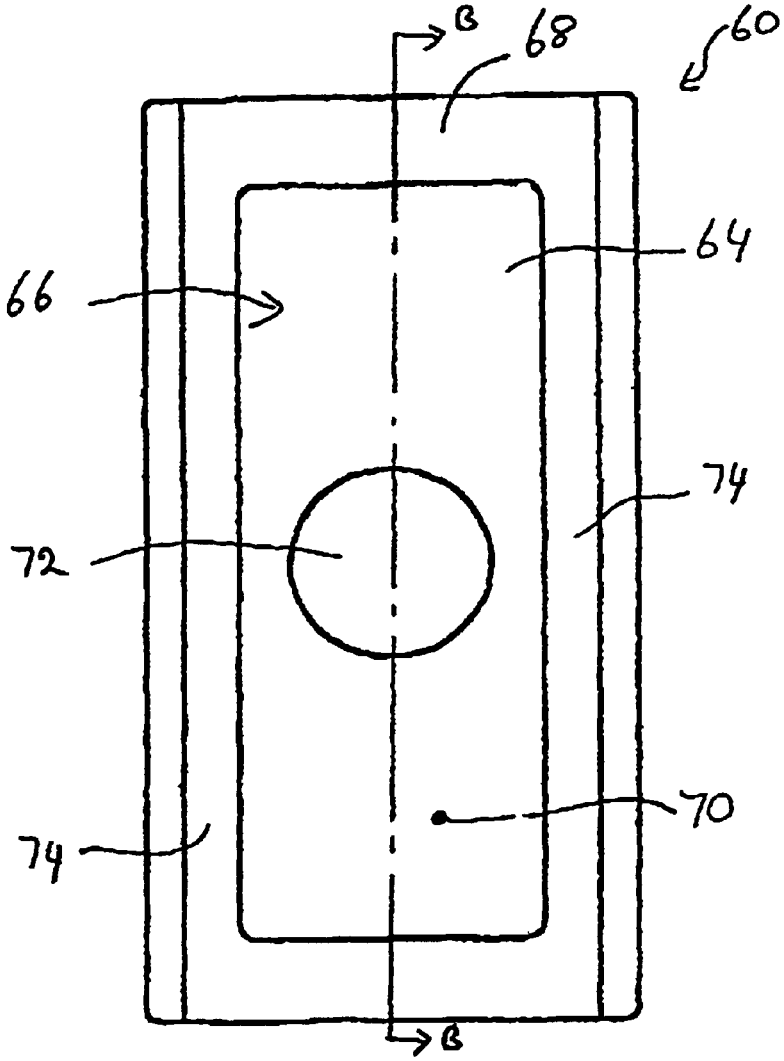
FIG. 10 is a rear elevation view of a stud for use with the rider of FIGS. 6 to 9.
Figure 12:
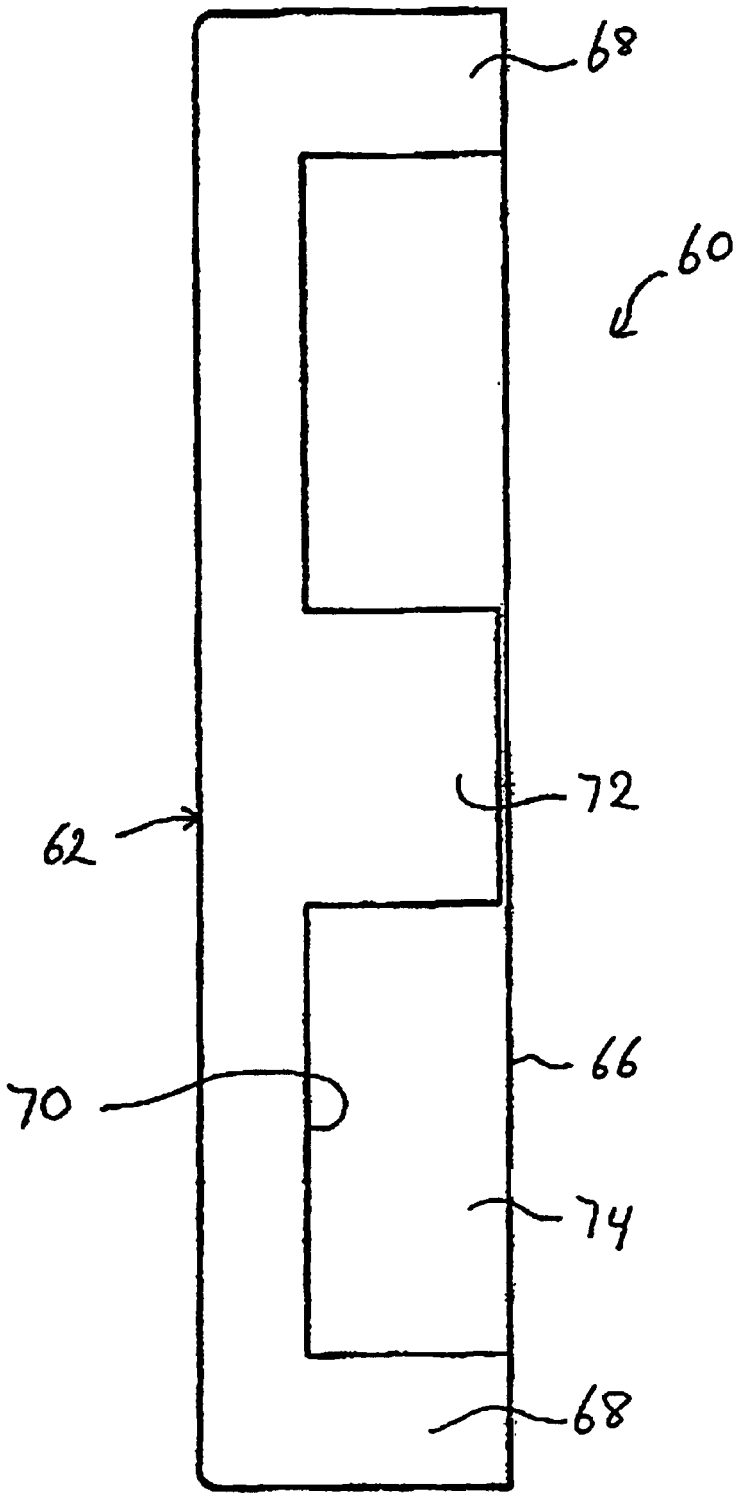
FIG. 12 is a cross-sectional view of the stud taken along line BB in FIG. 10.

Referring to FIGS. 10 to 12 there is shown a stud 60 for use with the rider 40. The stud 60 is generally rectangular with a plural front surface 62. The rear surface 64 has a rectangular recess 66 therein defined by peripheral walls 68 and side walls 74. Located in the centre of this recess 66 and extending from the base surface 70 toward the rear surface 64 is a circular pin 72. Preferably this pin extends just short of the rear surface 66.

The width between the side peripheral walls 74 and the distance between the pin 72 and the end walls is very slightly less than the diameter of the pins 52 of the rider 40 so that the stud may be mounted on the rider 40 by pressing the stud onto two of the pins 52 in an interference fit. This interference fit is preferably loose enough to enable easy separation and assembly of the two parts but tight enough to prevent accidental separation. The rider may be placed on the centre pin 52b and left hand pin 52a or the centre pin 52b and right hand pin 52c. Whilst a "two pin" stud has been shown, it will be appreciated that a "three-pin" stud which obscures all of the rider 40 may be used.

Because the rider has the same depth as the slot 28, the stud sits proud of the end wall. Further, because the protrusions 52 sit slightly below the centre-line of the rider, the bottom of the stud overlaps the end wall 30. The stud also overlaps the edge of the end wall, due to the angling of the ends of the slot 28. This overlapping of the end wall is neither essential or disadvantageous. If desired, the rider and stud may be made so that the stud overlaps the end wall 30 to a greater extent or not at all.

The tray 10, rider 40 and stud 60 can be manufactured either of low or high temperature material, which is able to withstand baking temperatures from 0 degrees to 200 degrees Celsius. For low temperature materials ABS plastics can be used. For high temperature materials, preferably compounded fiber plastics are used. Preferably the parts are manufactured in different colours to provide immediate visual information to the user. Preferably, the same material is used for all components to avoid problems with different rates of thermal expansion, but this is not essential. As examples, the tray may be manufactured of a blue plastics material with the rider being manufactured in red, yellow and orange colours. The stud may be manufactured in white and blue colours. This gives six different rider/stud colour combinations.

The colour of the rider may be used to indicate a temperature rating whilst the colour of the stud could be used to indicate the status of the chips to be housed. One colour could mean good chips and another colour could mean reject chips requiring further analysis.

A second rider/stud may be provided to indicate the specific chip in a family of chips which is carried by the tray. Additional recesses and indicators as needed fall within the scope of the invention.

The use of contrasting colours also aids the user in both segregating different "types" of trays from each other but also aids in corrected alignment. For example, a yellow rider with a red 2 pin stud may be provided. The user will be educated to align the trays with the rider/stud combination at one end with the exposed part of the yellow rider to the right of the red stud.

It will be appreciated that the rider may be provided with more than three pins. For example, a four pin rider will allow a "two pin" stud to be placed centrally, with a pin exposed on either side or to be located to one side, with two pins exposed on either the left or right. Use of a three pin stud would allow one or two pins to be exposed, to either the left or right side of the stud. Thus the number and position of the exposed pins may be used in sorting and alignment, as well as the colours of the pin and stud.

Whilst the engagement of the rider with the tray in the preferred form of the invention utilises a recess into which the rider slides, the invention is not limited to this specific format. For example, the same pin/recess interference fit type engagement may be utilised to attach the rider to the tray.

It will be appreciated that many modifications may be made to the embodiment described herein to those skilled in the art without departing from the spirit or scope of the invention.

What is claimed is:

1. A matrix tray carrier for supporting one or more articles, the matrix tray carrier comprising:

a main body for supporting the one or more articles and having at least one engagement means, at least one indicator means for engagement with the engagement means, the at least one indicator means providing information to an observer regarding the matrix tray carrier or the articles supported thereon, the at least one indicator means having a first rider part adapted to engage the engagement means of the main body and a second stud part releasably attachable to the first rider part.

2. The matrix tray carrier of claim 1 wherein said indicator means have one or more colors which provide information to the observer.

3. The matrix tray carrier of claim 1 wherein the main body has a first color and the indicator means have one or more different colors.

4. The matrix tray carrier of claim 1 wherein the second stud part is releasably attachable to the first rider part in at least two positions.

5. The matrix tray carrier of claim 1 wherein the second stud part is releasably attachable to the first rider part in at least two orientations.

6. The matrix tray carrier of claim 1 wherein the first rider path has surface portions which provide information to the user.

7. The matrix tray carrier of claim 1 wherein the second stud part has surface portions which provide information to the observer.

8. The matrix tray carrier of claim 1 wherein the first rider part and the second stud part have at least one complimentary protrusion and at least one recess for receiving the at least one complimentary protrusion such that the second stud part is releasably attachable to the first rider part.

9. The matrix tray carrier of claim 1 wherein the engagement means has a recess, the indicator means received in the recess.

10. The matrix tray carrier of claim 1 wherein the engagement means is engaged by the indicator means in only one orientation.

11. The matrix tray carrier of claim 1 wherein the one or more articles are semiconductor chips.

12. The matrix tray carrier of claim 1 wherein the main body is made of a material capable of withstanding a baking temperature of up to 200°.

13. The matrix tray carrier of claim 1 wherein the at least one indicator means is made of a material capable of withstanding a baking temperature of up to 200°.

*14. A matrix tray carrier for supporting one or more articles, comprising:*

*a main body for supporting the one or more articles and having a plurality of receptacles adapted to receive and support the one or more articles, at least some of the receptacles being aligned along one side of the main body and having an open end lying generally in a plane;*

*an end wall along the one side of the main body and extending away from the receptacles, the end wall including at least one engagement means, comprising a slot near an edge of the end wall; and*

*at least one indicator means for engagement with the engagement means, the at least one indicator means providing information to an observer regarding the matrix tray carrier or the one or more articles, the at least one indicator means comprising a rider that is configured to be received into the slot such that the rider is moveable relative to the slot in a direction that is generally perpendicular to the plane and is secured within the slot against movement in a direction that is generally parallel to the plane.*

*15. The matrix tray of claim 14, wherein the slot has a side wall having at least a portion arranged at an oblique angle relative to the edge of the end wall.*

*16. The matrix tray of claim 14, wherein the slot includes opposing side walls each having a portion arranged at an oblique angle relative to the edge of the end wall.*

*17. The matrix tray of claim 14, wherein the slot has a width in a direction that is generally parallel to the edge of the end wall and wherein the width is greater near the receptacles than near the edge of the end wall.*

*18. The matrix tray of claim 14, wherein the end wall and the receptacles are a first color and the rider is a second, different color.*

*19. The matrix tray of claim 18, wherein the second color is indicative of contents in the receptacles.*

*20. The matrix tray of claim 14, wherein the slot is at least partially open along the edge of the end wall such that at least a portion of the rider is visible along the edge.*

*21. The matrix tray of claim 14, wherein the rider has at least one securing member on at least one side of the rider and including a stud that is adapted to be secured to the securing member.*

*22. The matrix tray of claim 14, wherein the end wall has a length and the slot has a width that is less than one-half the end wall length.*

*23. The matrix tray of claim 14, wherein the rider has a first surface that is visible when the rider is received in the slot and a second surface perpendicular to the first surface, and wherein the second surface is visible when the rider is received in the slot.*

* * * * *